United States Patent [19]

Poliniak et al.

[11] 3,935,332

[45] Jan. 27, 1976

[54] DEVELOPMENT OF POLY(1-METHYL-1-CYCLOPENTENE-SO$_2$) ELECTRON BEAM RESIST

[75] Inventors: Eugene Samuel Poliniak, Willingboro; Richard Joseph Himics, Skillman, both of N.J.

[73] Assignee: RCA Corporation, New York, N.Y.

[22] Filed: Jan. 9, 1975

[21] Appl. No.: 539,801

[52] U.S. Cl. .................. 427/43; 96/35.1; 96/36.2; 96/48 R; 96/115 R; 204/159.14; 260/79.3 A; 346/74 CR; 346/135; 427/44; 427/273; 427/350
[51] Int. Cl.$^2$ .................... B05D 3/06; G11B 9/00
[58] Field of Search ........ 427/43, 44, 273; 96/35.1, 96/33, 36.2, 48 R, 115 R; 179/100.3 C, 100.4 C; 346/1, 74 CR, 135; 204/159.14; 260/79.3 A

[56] References Cited

UNITED STATES PATENTS

| | | | |
|---|---|---|---|
| 3,576,791 | 4/1971 | Holler et al. | 260/79.3 A |
| 3,723,591 | 3/1973 | Bauer et al. | 260/79.3 A |
| 3,884,696 | 5/1975 | Bowden et al. | 204/159.14 |

OTHER PUBLICATIONS

Thompson et al., "J. Electrochem. Soc." Vol. 120 No. 12 Dec. 1973 pp. 1722–1726.

Primary Examiner—J. H. Newsome
Attorney, Agent, or Firm—Glenn H. Bruestle; Birgit E. Morris

[57] ABSTRACT

Three developer solvents 2-methylcyclohexanone, 3-methylcyclohexanone, and a mixture of acetonyl acetate and acetone, improve the resolution of electron beam exposed films of poly(1-methyl-1-cyclopentene-SO$_2$) copolymers.

6 Claims, 5 Drawing Figures

DEVELOPMENT OF POLY(1-METHYL-1-CYCLOPENTENE-SO$_2$) ELECTRON BEAM RESIST

This invention relates to a process for developing electron beam resists. More particularly, this invention relates to a process for developing certain exposed olefin-SO$_2$ copolymer electron beam resists to improve resolution.

BACKGROUND OF THE INVENTION

Photolithographic techniques have long been employed in the microelectronics and information industries to transfer information from a modulated light beam to a recording medium in the form of a surface relief pattern. The recording medium contains a photoresist, which is a material that changes its solubility in certain solvents after exposure to light. Thus, after exposure, the more soluble portions of the resist can be removed by contact with a developer solvent.

As these industries have become more sophisticated, the need for recording information at ever-increasing density has become apparent. Since electron beams can be more highly focussed than light beams, they allow for increased density of information and their use is supplanting light beams for recording. However, since materials which are sensitive to light beams are not necessarily sensitive to electron beams, new electron beam sensitive materials are being sought.

Thompson and Bowden, J. Electrochem. Soc., Vol. 120, December 1973, pp. 1722–1726, have disclosed that copolymers of olefins and SO$_2$ in film form are effective positive-working electron beam resists. These copolymers are spun or cast from solution onto a substrate, exposed to a modulated, information carrying electron beam and developed by treatment with a suitable solvent. As is known, a careful choice of developer solvent must be made for each polysulfone to maximize the resolution of the developed film. In the case of very fast working solvents solvent-nonsolvent mixtures can be employed to reduce undue erosion of the unexposed portions of the resist.

Electron beam recording has been found to be very useful in the preparation of masters for a grooved record which carries audio, video and color information in the form of a surface relief pattern in the bottom of the small groove. Such recording has been disclosed in U.S. Pat. No. 3,842,217 to Clemens. The requirements for an acceptable positive electron beam resist for this application are stringent. The resist must be highly sensitive, that is undergo a large change in solubility when struck by electrons. In addition, since resist films for this application are employed in comparatively thick layers that are not developed through to the substrate, as contrasted with thinner resist films employed as masks which are developed through to the substrate for subsequent etching of the substrate, the present resist films must also be capable of high resolution whereby, after development, the surface relief pattern must have straight-walled troughs or developed regions. The sharper the geometry of the relief pattern, the higher the quality of the recording. As a further requirement, it is desired that the unexposed portions of the resist be highly insoluble to the developer solvent. When information corresponding to both audio and video information, which varies greatly in frequency, is recorded in the resist, the height of the unexposed portion of the resist should remain constant after development to increase the resolution of the recorded information.

Thus a sensitive electron beam resist which can be applied in comparatively thick films, and a process for developing it to form straight-walled surface relief patterns of high resolution, without dissolving the unexposed resist, has been sought.

SUMMARY OF THE INVENTION

We have found that poly(1-methyl-1-cyclopentene-SO$_2$) copolymer has excellent sensitivity to electron beams and that it can be developed with particular solvents to obtain a highly resolved surface relief pattern of excellent geometry.

DETAILED DESCRIPTION OF THE INVENTION

Figure 1:
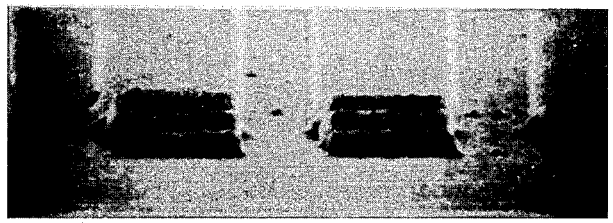
FIGS. 1–4 are photomicrographs of 1-methyl-1-cyclopentene-SO$_2$ copolymer films exposed and developed with a solvent according to the invention.

Poly(1-methyl-1-cyclopentene-SO$_2$) copolymer is prepared in known manner by condensing SO$_2$ in a dry ice/acetone-cooled gas trap, adding 1-methyl-1-cyclopentene with stirring and a free radical initiator such as t-butyl hydroperoxide, and allowing the polymerization to proceed at temperatures from about −55° to about −80°C. Alternatively, UV-induced polymerization of the olefin and SO$_2$ can be employed, using azobisisobutyronitrile as an initiator. Polymerization is generally complete in from about 30 minutes to about 10 hours. The molecular weight of the resultant copolymer can be controlled by varying the relative amount of olefin and SO$_2$, by varying the temperature, i.e., reaction at higher temperatures produces a lower molecular weight copolymer, and by varying the initiator type and concentration. In general, copolymers having a molecular weight between about 50,000 and about 1,000,000 are suitable as electron beam resists. The preferred molecular weight range for SO$_2$-1-methyl-1-cyclopentene copolymers is from about 100,000 to about 500,000.

The copolymer obtained as above can be purified by dissolving it in a solvent, for example a chlorinated hydrocarbon, and precipitating it with a nonsolvent, suitably an alcohol such as methanol.

The copolymer is cast or spun from solution onto the desired support, as is disclosed in a copending application Ser. No. 539,851 filed Jan. 9, 1975 of Poliniak et al., "Preparation of Olefin-SO$_2$ Copolymer Electron Beam Resist Films", filed concurrently herewith and incorporated herein by reference. The copolymer solution is microfiltered so as to remove particles larger than about 0.2 micron. When employed to prepare video disc masters, a 7% solution is spun at about 400 rpm onto a copper plated, grooved master to a thickness of about 1 micron. The coating is dried by placing the coated master in a vacuum chamber which is evacuated to a pressure of at least 10$^{-6}$ torr for about 12–24 hours. If they are not to be used immediately, the films can be stored in a moisture-free atmosphere.

Prior to exposure to an electron beam, an electrically-conductive layer must be present to remove the charge after electron beam exposure. In the event that the support is nonconducting, a thin conductive film is applied either to the support prior to coating of the resist, or, applied to the surface of the prepared recording medium. For example, glass substrates can be coated with conductive layers of tin oxide or indium oxide, or with a conductive metal film of nickel, copper and the like.

The coated substrate is then exposed to an electron beam of a variable-speed scanning electron microscope.

There are many solvents that will develop or partially develop exposed poly(1-methyl-1-cyclopentene-$SO_2$) films but only three, out of many that have been tried, have been found to give maximum resolution to films having a minimum of exposure to the information carrying beam of electrons; these are 2-methylcyclohexanone, 3-methylcyclohexanone and a mixture of acetonyl acetate and acetone. The unexposed poly(1-methyl-1-cyclopentene-$SO_2$) film is highly insoluble in these solvents; thus use of these solvents ensures that there is almost no dissolution of the unexposed regions of the resist.

The invention will be further illustrated by the following Example. However, it is to be understood that the invention is not meant to be limited to the details described therein.

EXAMPLE

A cyclopentanone solution containing 10% by weight of a copolymer of $SO_2$ and 1-methyl-1-cyclopentene having a molecular weight of about 175,000 was filtered successively through 5.0, 1.0, 0.5 and 0.2 micron filters. The filtered solution was spun at 1000 rpm onto glass plates coated with a thin film of chromium-nickel. The resultant copolymer films were about 1 micron thick.

The coated glass plates were dried by placing in a vacuum chamber which was evacuated to a pressure of $10^{-6}$ torr for 18 hours. The dried plates were stored in a desiccator.

The films were exposed to the beam of a scanning electron microscope at an accelerating potential of 10 kV and a beam current of 3nA. An approximately Gaussian-shaped beam having a full width at one-half amplitude of about 0.5 micron was scanned to describe rasters on the surface of the films at various speeds, thereby varying the total exposure of the films to the beam.

The exposed films were developed by immersing in a variety of solvents to determine which solvent would give the highest sensitivity. The data is summarized below wherein is noted the minimum amount of exposure to the beam required to obtain clear, well-defined raster lines. Charge densities of 26, 6.7, 2,6 and 1.3 microcoulombs/$cm^2$ correspond to scanning speeds of 2.5, 10, 25 and 50 cm/second respectively.

TABLE I

| Developer Solvent | Charge Density, Microcoulombs/$cm^2$ | | | |
|---|---|---|---|---|
| | 26 | 6.7 | 2.6 | 1.3 |
| carbon tetrachloride | X | | | |
| toluene | | X | | |
| xylene | X | | | |
| ethanol | X | | | |
| isopropanol | X | | | |
| butanol | X | | | |
| isobutanol | X | | | |
| isoamyl alcohol | X | | | |
| cyclohexanol | X | | | |
| 4-heptanol | X | | | |
| octanol-1 | X | | | |

TABLE I-continued

| Developer Solvent | Charge Density, Microcoulombs/$cm^2$ | | | |
|---|---|---|---|---|
| | 26 | 6.7 | 2.6 | 1.3 |
| octanol-2 | X | | | |
| docanol | X | | | |
| acetone | | | X | |
| methyl ethyl ketone | | X | | |
| methyl isobutyl ketone | X | | | |
| 3-pentanone | X | | | |
| cyclohexanone | | X | | |
| cycloheptanone | | | X | |
| 2-methylcyclohexanone | | | | X |
| 3-methylcyclohexanone | | | | X |
| 4-methylcyclohexanone | | | X | |
| pentoxane | | X | | |
| acetal acetone | | X | | |
| methyl acetate | | X | | |
| ethyl acetate | | X | | |
| 30% acetonyl acetate-(70% acetone) | | | | X |
| acetonitrile | | X | | |
| nitromethane | | X | | |
| dimethyl sulfoxide | | | X | |
| sodium hydroxide | X | | | |
| AZ 1350 developer* | X | | | |

*product of Azoplate Co.

Thus only three developer solvents could be employed at a charge density of 1.3 microcoulombs/$cm^2$.

Figure 2:
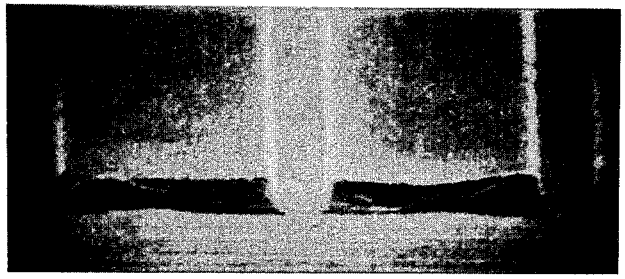
Figure 3:
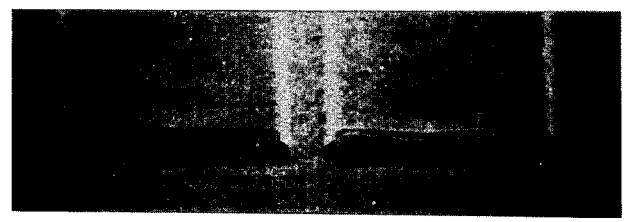
Figure 4:
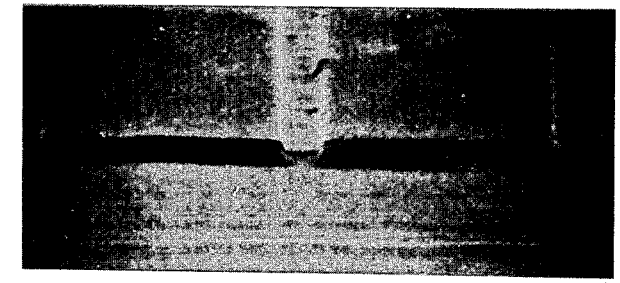

FIGS. 1–4 are photomicrographs of exposed films which were evaporation-coated with a layer of gold about 1000 Angstroms thick, using 2-methylcyclohexanone as the developer solvent. FIG. 1 was exposed at a scanning speed of 2.5 cm/second and gave line widths of 1.1 micron. FIG. 2 was exposed at a speed of 10 cm/second to give line widths of 0.85 micron. FIG. 3 was exposed at a speed of 25 cm/second to give line widths of 0.65 micron. FIG. 4 was exposed at a speed of 50 cm/second to give line widths of 0.6 micron.

Measurement of the film before and after development revealed that no erosion of the nonexposed areas of the film occurred.

COMPARATIVE EXAMPLE

The procedure of Example 1 was followed substituting other polymers using 2-methylcyclohexanone as the developer solvent. The results are summarized below in Table II.

TABLE II

| Polymer | Results |
|---|---|
| 2-methyl-1-pentene-$SO_2$ copolymer | stripped film at all scanning speeds |
| 3-methyl-1-cyclopentene-$SO_2$ copolymer | stripped the film |
| Cyclopentene-$SO_2$ copolymer | no development |
| 1-methyl-1-cyclopentene + 5% decene-1-$SO_2$ terpolymer* | pitted surface of irregular troughs |

Figure 5:
FIG. 5 is a photomicrograph of a film of the same copolymer developed with a different solvent system.

*see FIG. 5

We claim:
1. In a method of recording information whereby a modulated beam of electrons is scanned across the surface of a film of resist material which becomes more soluble in a developer solvent where impinged upon by the beam of electrons and the resist material is developed with the developer solvent so as to remove the solubilized portions thereof, the improvement which comprises employing as the resist material a film of a copolymer of $SO_2$ and 1-methyl-1-cyclopentene and developing with a solvent selected from the group con- sisting of 2-methylcyclohexanone, 3-methylcyclohexanone, and acetonyl acetate in acetone.

2. A method according to claim 1 wherein the developer solvent is 2-methylcyclohexanone.

3. A method according to claim 1 wherein the developer solvent is 3-methylcyclohexanone.

4. A method according to claim 1 wherein the developer solvent contains 30% by volume of acetonyl acetate in acetone.

5. A method according to claim 1 wherein the resist film is about 1 micron thick.

6. A method according to claim 1 wherein the copolymer has a molecular weight in the range of from about 100,000 to about 500,000.

* * * * *